(12) United States Patent
Sano et al.

(10) Patent No.: US 8,716,672 B2
(45) Date of Patent: May 6, 2014

(54) CHARGED PARTICLE OPTICAL SYSTEM, DRAWING APPARATUS, AND METHOD OF MANUFACTURING ARTICLE

(71) Applicant: Canon Kabushiki Kaisha, Tokyo (JP)

(72) Inventors: Kentaro Sano, Utsunomiya (JP); Masato Muraki, Inagi (JP); Akira Miyake, Nasukarasuyama (JP); Yoshikiyo Yui, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/835,154

(22) Filed: Mar. 15, 2013

(65) Prior Publication Data

US 2013/0273478 A1  Oct. 17, 2013

(30) Foreign Application Priority Data

Apr. 13, 2012 (JP) ................. 2012-092478
Jan. 29, 2013 (JP) ................. 2013-014833

(51) Int. Cl.
*H01J 3/14* (2006.01)
*H01J 3/12* (2006.01)
*H01J 1/46* (2006.01)

(52) U.S. Cl.
USPC ............ 250/396 R; 250/492.22; 313/349; 313/350

(58) Field of Classification Search
USPC ............ 250/396 R, 492.2, 492.21, 492.22, 250/492.3; 313/349, 350
See application file for complete search history.

(56) References Cited

U.S. PATENT DOCUMENTS

| | | | |
|---|---|---|---|
| 3,864,797 A * | 2/1975 | Banks | 445/47 |
| 4,714,831 A * | 12/1987 | Clark et al. | 250/305 |
| 5,350,926 A * | 9/1994 | White et al. | 250/492.21 |
| 5,874,739 A | 2/1999 | Buschbeck et al. | |
| 6,326,632 B1 | 12/2001 | Buschbeck et al. | |
| 6,528,799 B1 * | 3/2003 | Katsap et al. | 250/398 |
| 7,345,290 B2 * | 3/2008 | Katsap et al. | 250/492.2 |
| 2012/0241641 A1* | 9/2012 | Sano et al. | 250/396 R |
| 2012/0295202 A1* | 11/2012 | Sano | 430/296 |
| 2012/0295203 A1* | 11/2012 | Sano | 430/296 |

FOREIGN PATENT DOCUMENTS

| | | |
|---|---|---|
| JP | 10-149794 A | 6/1998 |
| JP | 2000-164508 A | 6/2000 |

* cited by examiner

*Primary Examiner* — Bernard E Souw
(74) *Attorney, Agent, or Firm* — Rossi, Kimms & McDowell LLP

(57) ABSTRACT

The present invention provides a charged particle optical system which emits a charged particle beam, the system including an electrostatic lens, and a grid electrode opposed to the electrostatic lens along an optical axis of the electrostatic lens, and configured to form an electrostatic field in cooperation with the electrostatic lens, wherein the grid electrode is configured such that an electrode surface, opposed to the electrostatic lens, of the grid electrode has a distance, from the electrostatic lens in a direction of the optical axis, which varies with a position in the electrode surface.

28 Claims, 17 Drawing Sheets

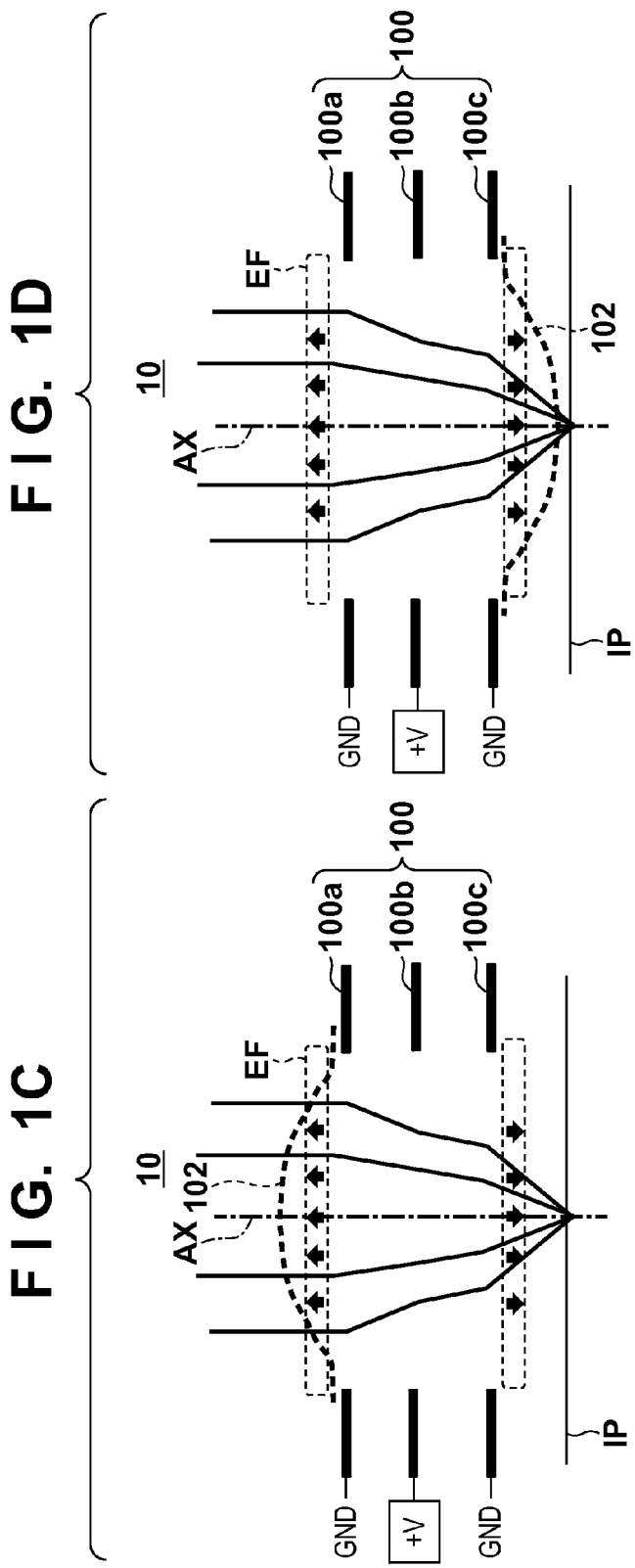

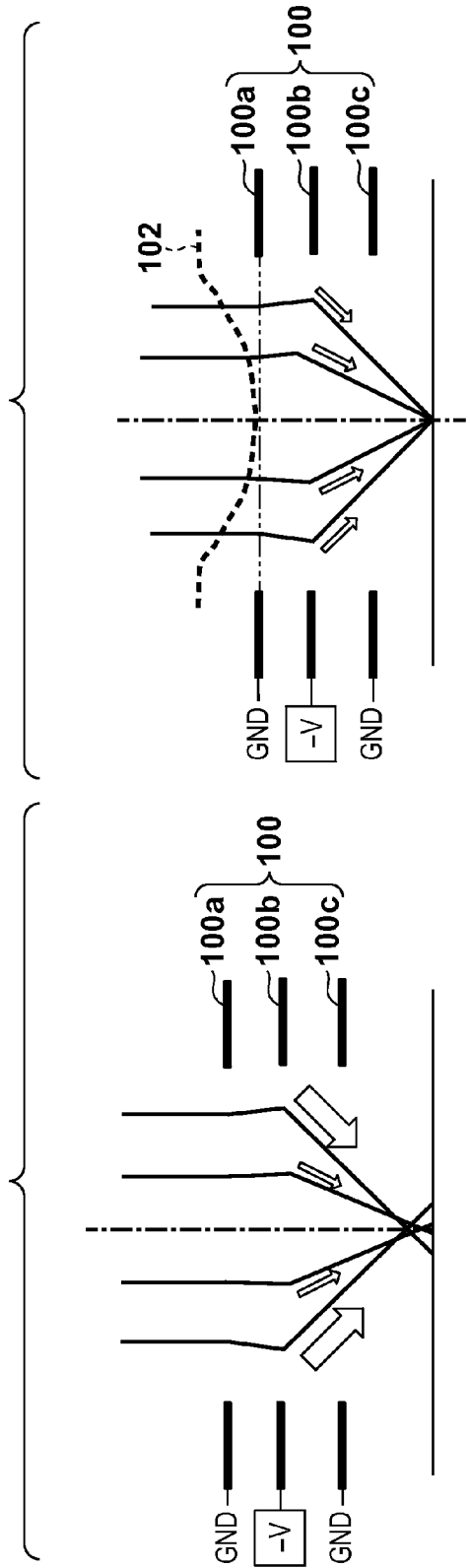

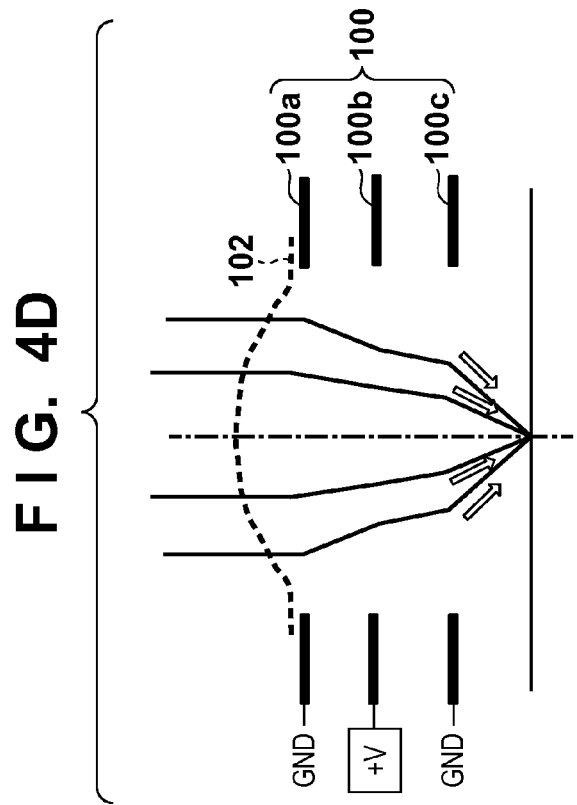
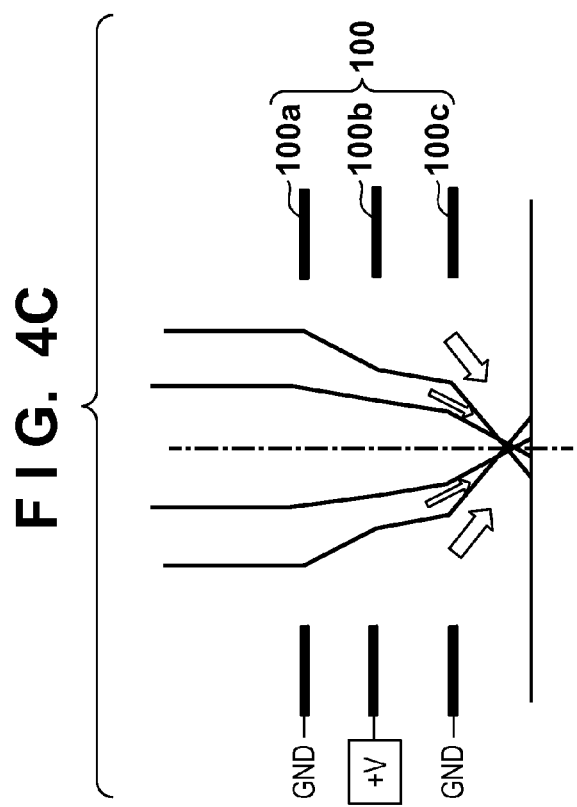

FIG. 5E

|  | 5A | 5B | 5C |
|---|---|---|---|
| Space between electrodes | 20mm | 20mm | 20mm |
| Diameter of electrodes | 20mm | 20mm | 20mm |
| Electrode thickness | 1mm | 1mm | 1mm |
| Electron Voltage | 5kV | 5kV | 5kV |
| Upper electrode voltage | GND | GND | GND |
| Center electrode voltage | +19.4kV | +28.9kV | +23.5kV |
| Lower electrode voltage | GND | GND | GND |
| Grid | No grid | Flat grid | Concave (parabola) |
| Space Between grid & lower electrode |  | 10mm | 10mm |
| Parabolic coefficient |  | 0 | +0.046 |
| Non-telecentricity @3mm illumination | 1mrad | >3mrad | <0.1mrad |

FIG. 6E

| | 6A | 6B | 6C |
|---|---|---|---|
| Space between electrodes | 20mm | 20mm | 20mm |
| Diameter of electrodes | 40mm | 40mm | 40mm |
| Electrode thickness | 1mm | 1mm | 1mm |
| Electron Voltage | 5kV | 5kV | 5kV |
| Upper electrode voltage | GND | GND | GND |
| Center electrode voltage | −7.4kV | −5.8kV | −5.3kV |
| Lower electrode voltage | GND | GND | GND |
| Grid | No grid | Flat grid | Concave (parabola) |
| Space Between grid & lower electrode | | 3mm | 3mm |
| Parabolic coefficient | | 0 | −0.02 |
| Non-telecentricity @4mm illumination | > 5mrad | > 1mrad | < 0.1mrad |

CHARGED PARTICLE OPTICAL SYSTEM, DRAWING APPARATUS, AND METHOD OF MANUFACTURING ARTICLE

BACKGROUND OF THE INVENTION

1. Field of the Invention

The present invention relates to a charged particle optical system, a drawing apparatus, and a method of manufacturing an article.

2. Description of the Related Art

Japanese Patent Laid-Open Nos. 2000-164508 and 10-149794 disclose techniques of bringing a grid into proximity to an electrostatic lens to reduce the aberration of the electrostatic lens. With these techniques, a grid used as a mask is disposed to be immersed in the electrostatic field of an electrostatic lens (a grid is disposed at the position at which it influences the electrostatic field of the electrostatic lens) to obtain a negative refractive power, thereby reducing the aberration of an electrostatic lens system.

However, charged particle optical systems according to conventional techniques are incapable of satisfying recently required specifications because they cannot sufficiently reduce aberrations.

SUMMARY OF THE INVENTION

The present invention provides, for example, a charged particle optical system advantageous in terms of reduction of its aberration.

According to one aspect of the present invention, there is provided a charged particle optical system which emits a charged particle beam, the system including an electrostatic lens, and a grid electrode opposed to the electrostatic lens along an optical axis of the electrostatic lens, and configured to form an electrostatic field in cooperation with the electrostatic lens, wherein the grid electrode is configured such that an electrode surface, opposed to the electrostatic lens, of the grid electrode has a distance, from the electrostatic lens in a direction of the optical axis, which varies with a position in the electrode surface.

Further features of the present invention will become apparent from the following description of exemplary embodiments with reference to the attached drawings.

BRIEF DESCRIPTION OF THE DRAWINGS

FIGS. 1A to 1D are schematic views each showing the configuration of a charged particle optical system according to one aspect of the present invention.

FIGS. 4A to 4D are views for explaining details of the configuration of the charged particle optical system shown in FIGS. 1A to 1D.

FIGS. 5A to 5E are views for explaining an effect of disposing a curved grid in a charged particle optical system including an electrostatic lens.

FIGS. 6A to 6E are views for explaining another effect of disposing a curved grid in a charged particle optical system including an electrostatic lens.

DESCRIPTION OF THE EMBODIMENTS

Figure 1A:
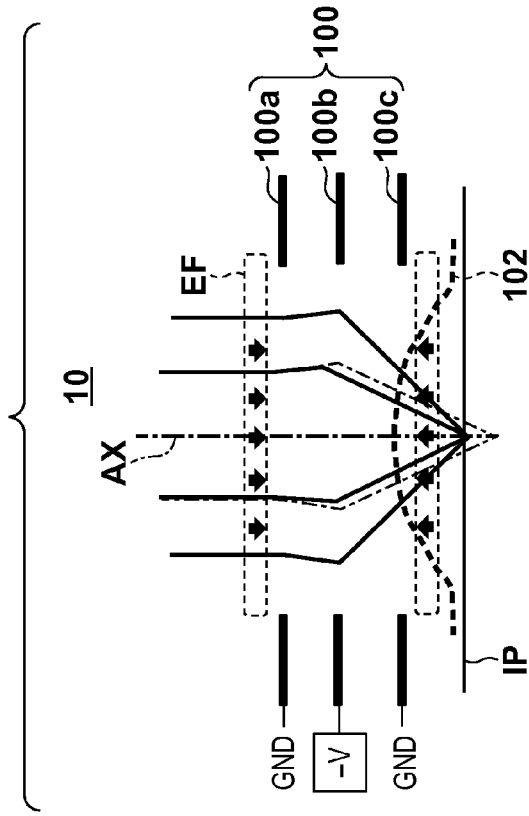

Preferred embodiments of the present invention will be described below with reference to the accompanying drawings. Note that the same reference numerals denote the same members throughout the drawings, and a repetitive description thereof will not be given.

First Embodiment

FIGS. 1A to 1D are schematic views each showing the configuration of a charged particle optical system 10 according to one aspect of the present invention. In this embodiment, the charged particle optical system 10 includes an electrostatic lens 100 and grid (grid electrode) 102, and emits an electron beam as a charged particle beam. However, the charged particle beam is not limited to an electron beam, and may be, for example, an ion beam.

The electrostatic lens 100 is formed by, for example, three electrodes: an upper electrode 100a, an intermediate electrode 100b, and a lower electrode 100c having apertures which pass a charged particle beam. The electrostatic lens 100 is a so-called Einzel lens having a grounded upper electrode 100a or lower electrode 100c, and an intermediate electrode 100b applied with a negative or positive voltage.

The grid 102 is disposed in proximity to the upper electrode 100a or lower electrode 100c of the electrostatic lens 100 so as to be immersed in an electrostatic field EF formed by the electrostatic lens 100. In other words, the grid 102 is opposed to the electrostatic lens 100 along an optical axis (lens axis) AX of the electrostatic lens 100 to form an electrostatic field in cooperation with the electrostatic lens 100. The grid 102 has a curved surface shape which forms a convex surface bulged toward the electrostatic lens 100 (that is, which bulges toward the electrostatic lens 100) in each of the charged particle optical systems 10 shown in FIGS. 1A and 1B. The grid 102 also has a curved surface shape which forms a concave surface receding from the electrostatic lens 100 (that is, which recedes from the electrostatic lens 100) in each of the charged particle optical systems 10 shown in FIGS. 1C and 1D. Note that the curved surface shape includes not only a shape defined by a smooth curve as shown in FIGS. 1A to 1D, but also a shape defined by a straight line, such as a triangular or staircase shape.

The grid 102 has conductivity, and therefore defines a conductive surface (electrode surface) which controls the electrostatic field EF formed by the electrostatic lens 100. The grid 102 is implemented by, for example, a member obtained by setting a curvature in conductor wires arranged in a lattice pattern (for example, a square grid pattern), or a member obtained by forming an opening in a curved conductor plate. The grid 102 is intended to form an equipotential surface along its curved surface shape. Therefore, the grid 102 is not limited to the above-mentioned example, and can be, for example, a curved conductor structure with a substantially high numerical aperture as long as it can form an equipotential surface along its curved surface shape. Also, the curved surface shape of the grid 102 is desirably a paraboloid of revolution having a rotation axis (an axis of the revolution) along the axis (lens axis) AX of the electrostatic lens 100, as will be described later. However, the curved surface shape of the grid 102 may be a sphere having a rotation axis along the lens axis AX in terms of, for example, machinability. Also, the grid 102 need not have a rotationally symmetrical shape when, for example, the electrostatic lens 100 is a cylindrical lens.

Figure 1B:
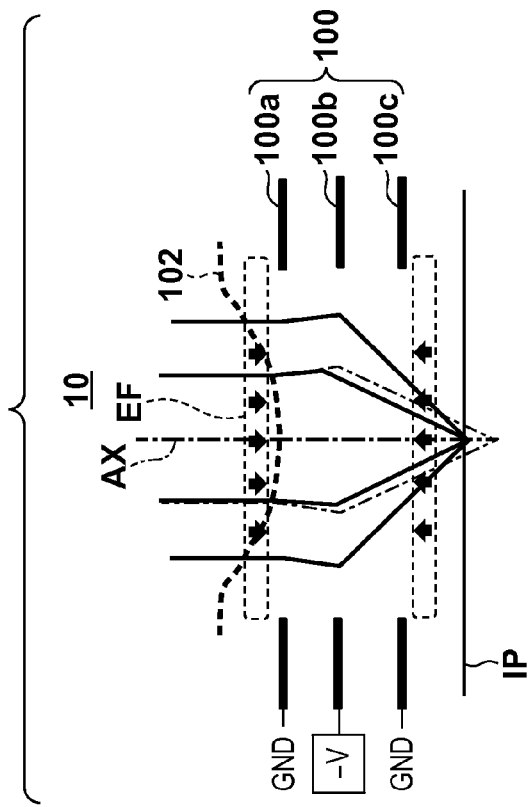

In each of the charged particle optical system 10 shown in FIGS. 1A and 1B, a negative voltage is applied to the intermediate electrode 100b, so an electrostatic field EF, as indicated by arrows, is formed near the exteriors of the upper electrode 100a and lower electrode 100c. The component of the electrostatic field EF in the direction of the lens axis AX is oriented from the grid 102 to the electrostatic lens 100.

On the other hand, in each of the charged particle optical system 10 shown in FIGS. 1C and 1D, a positive voltage is applied to the intermediate electrode 100b, so an electrostatic field EF, as indicated by arrows, is formed near the exteriors of the upper electrode 100a and lower electrode 100c. The component of the electrostatic field EF in the direction of the lens axis AX is oriented from the electrostatic lens 100 to the grid 102.

In this embodiment, if the component of the electrostatic field EF in the direction of the lens axis AX is oriented from the grid 102 to the electrostatic lens 100, the grid 102 has a shape which forms a convex surface bulged toward the electrostatic lens 100. However, if the component of the electrostatic field EF in the direction of the lens axis AX is oriented from the electrostatic lens 100 to the grid 102, the grid 102 has a shape which forms a concave surface receding from the electrostatic lens 100. Although this mechanism will be explained later, the aberration of the charged particle optical system 10 can be reduced more greatly than in the conventional techniques by determining the convex/concave shape of the grid 102 in accordance with the electrostatic field EF in a configuration in which the grid 102 is disposed to be immersed in the electrostatic field EF formed by the electrostatic lens 100.

Note that the relationship between the orientation of the component of the electrostatic field EF in the direction of the lens axis AX, and the convex/concave shape of the grid 102 on the side of the electrostatic lens 100 can be more generally represented using the orientation of an electrostatic force applied from the electrostatic field EF to the charged particle beam. If, for example, the component of an electrostatic force, which acts on the charged particle beam, in the direction of the lens axis AX is oriented from the grid 102 to the electrostatic lens 100, the grid 102 has a shape which forms a concave surface receding from the electrostatic lens 100. However, if the component of an electrostatic force, which acts on the charged particle beam, in the direction of the lens axis AX is oriented from the electrostatic lens 100 to the grid 102, the grid 102 has a shape which forms a convex surface bulged toward the electrostatic lens 100. The relationship in convex/concave shape of the grid 102 using an electrostatic force is applicable not only to an electron beam but also to other charged particle beams such as an ion beam.

Figure 2A:
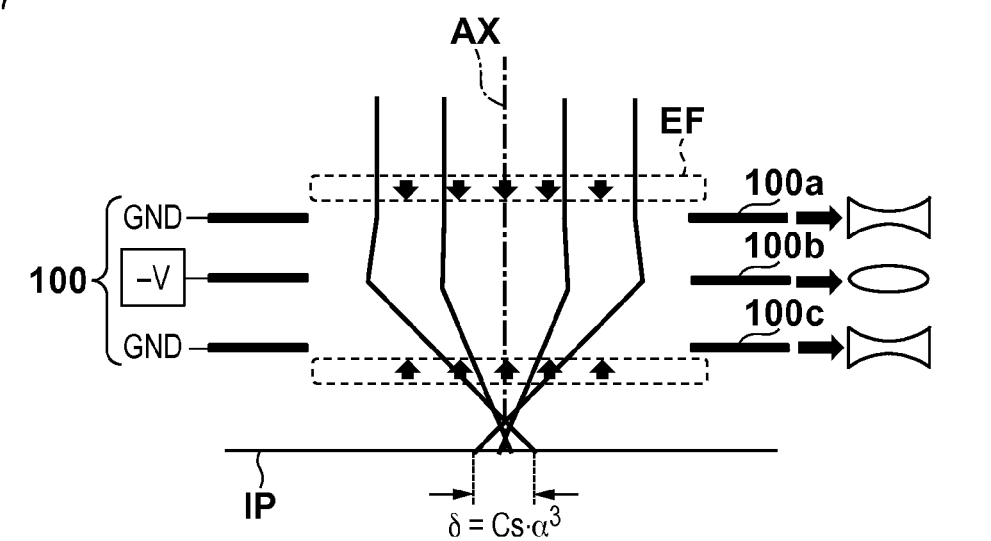
FIGS. 2A and 2B are views each showing the lens powers of the respective electrodes of an electrostatic lens when a negative or positive voltage is applied to the intermediate electrode of the electrostatic lens.
Figure 2B:
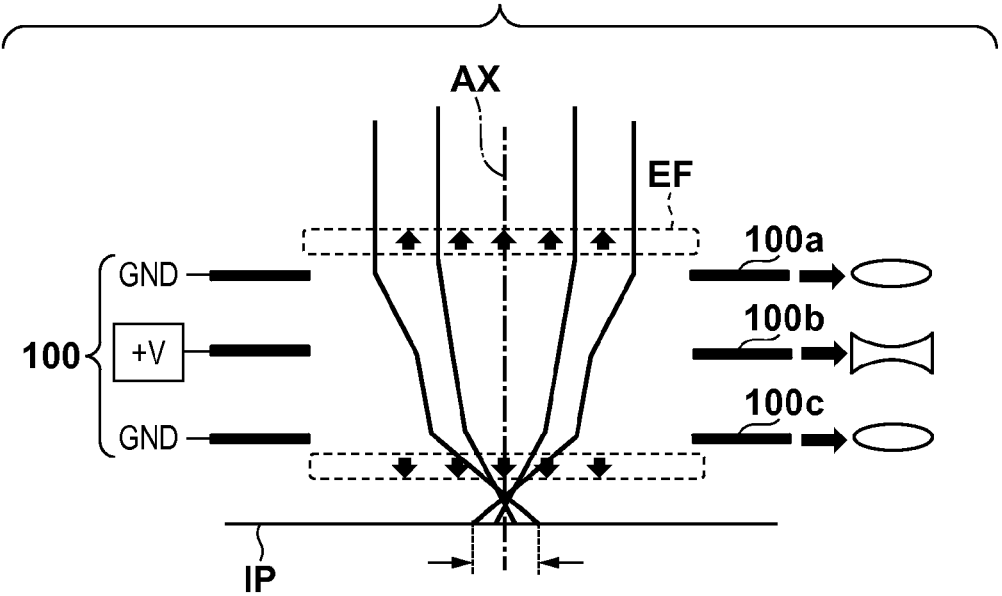

The principle of the present invention will be described with reference to FIGS. 2A, 2B, 3A to 3D, and 4A to 4D. FIG. 2A is a view showing the lens power of the respective electrodes of the electrostatic lens 100 when a negative voltage is applied to the intermediate electrode 100b of the electrostatic lens 100. FIG. 2B is a view showing the lens power of the respective electrodes of the electrostatic lens 100 when a positive voltage is applied to the intermediate electrode 100b of the electrostatic lens 100.

Referring to FIG. 2A, when a negative voltage is applied to the intermediate electrode 100b, the upper electrode 100a and lower electrode 100c have a concave lens power, the intermediate electrode 100b has a convex lens power, and the entire electrostatic lens 100 has a convex lens power. Also, the component of the electrostatic field EF, formed near the exterior of the electrostatic lens 100, in the direction of the lens axis AX is oriented from the exterior of the electrostatic lens 100 to the electrostatic lens 100, as indicated by arrows. Therefore, when the component of the electrostatic field EF in the direction of the lens axis AX is oriented from the exterior of the electrostatic lens 100 to the electrostatic lens 100, the outer electrodes of the electrostatic lens 100, that is, the upper electrode 100a and lower electrode 100c serve as concave lenses. This applies not only to an Einzel lens formed by three electrodes, but also to an electrostatic lens formed by electrodes having apertures in general.

On the other hand, referring to FIG. 2B, when a positive voltage is applied to the intermediate electrode 100b, the upper electrode 100a and lower electrode 100c have a convex lens power, the intermediate electrode 100b has a concave lens power, and the entire electrostatic lens 100 has a convex lens power. Also, the component of the electrostatic field EF, formed near the exterior of the electrostatic lens 100, in the direction of the lens axis AX is oriented from the electrostatic lens 100 to the exterior of the electrostatic lens 100, as indicated by arrows. Therefore, when the component of the electrostatic field EF in the direction of the lens axis AX is oriented from the electrostatic lens 100 to the exterior of the electrostatic lens 100, the outer electrodes of the electrostatic lens 100, that is, the upper electrode 100a and lower electrode 100c serve as convex lenses. This applies not only to an Einzel lens formed by three electrodes, but also to an electrostatic lens formed by electrodes having apertures in general, as described above.

As can be seen from the foregoing description, the orientation of the component of the electrostatic field EF in the direction of the lens axis AX is associated with the lens powers of the upper electrode 100a and lower electrode 100c (the outer electrodes of the electrostatic lens 100). This is the first important feature in understanding the principle of the present invention.

FIGS. 2A and 2B also show the state in which a blur has occurred on an image plane IP of the electrostatic lens 100 due to spherical aberration that generally acts as a dominant component of the aberration of the electrostatic lens 100. An amount of blur $\delta$ in FIGS. 2A and 2B can be expressed as $\delta = C_s \alpha^3$ where $C_s$ is the spherical aberration coefficient of the electrostatic lens 100, and $\alpha$ is the half-angle of convergence of the charged particle optical system 10. The spherical aberration generated when an electrostatic lens is formed is generally positive. This means that the generated aberration has a lens power that becomes higher in a region closer to the exterior of the lens axis of the electrostatic lens 100 (in a direction away from the lens axis of the electrostatic lens 100). Hence, to cancel (reduce) such a (positive) spherical aberration, it is only necessary to perform correction so that the lens power becomes lower in a region closer to the exterior of the lens axis of the electrostatic lens 100. This is the second important feature in understanding the principle of the present invention.

FIGS. 3A to 3D and 4A to 4D are views for explaining details of how to perform correction so that the lens power becomes lower in a region closer to the exterior of the lens axis of the electrostatic lens 100 in this embodiment. FIGS. 3A to 3D are views showing the relationship between the lens power and the gap between the electrostatic lens 100 (upper electrode 100a) and a flat grid 302 in a configuration in which the grid 302 is disposed to be immersed in the electrostatic field of the electrostatic lens 100, as in the conventional techniques. The flat grid 302 has a shape with a distance from the electrostatic lens 100 in the direction of the lens axis AX of the electrostatic lens 100, which remains constant independently of the position.

Figure 3A:
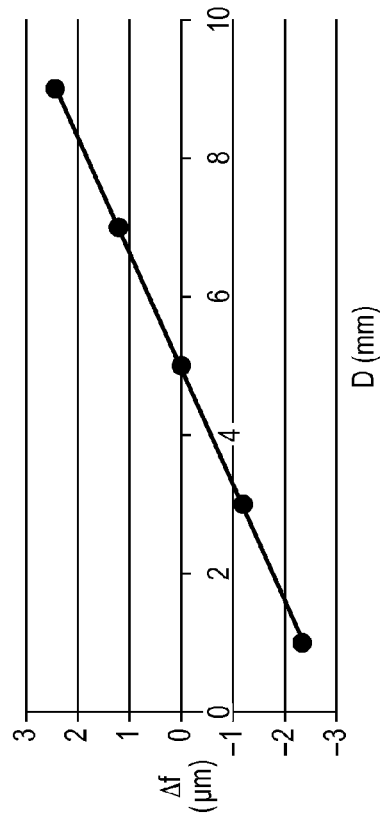
FIGS. 3A to 3D are views each showing the relationship between the lens power and the interval between an electrostatic lens and a flat grid in a configuration in which the grid is disposed to be immersed in the electrostatic field of the electrostatic lens.
Figure 3B:
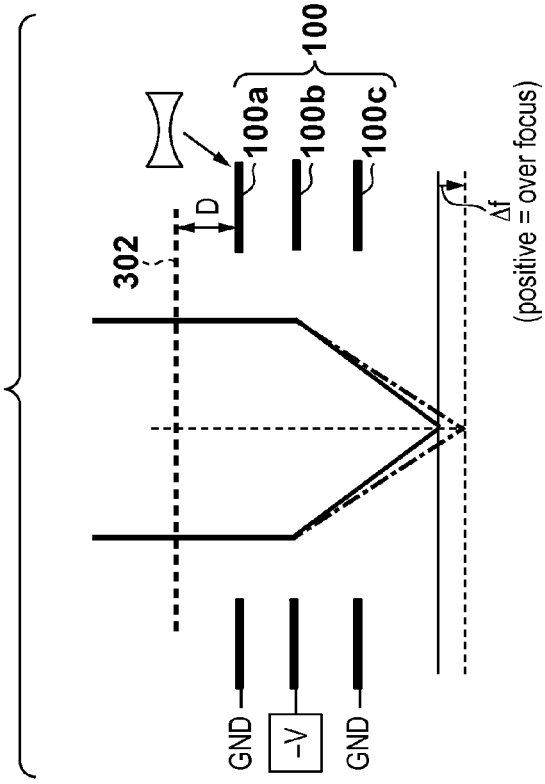

FIG. 3A shows the state in which a negative voltage is applied to the intermediate electrode 100b of the electrostatic lens 100 (the upper electrode 100a has a concave lens power). FIG. 3A shows the gap D between the electrostatic lens 100 and the grid 302 on the abscissa, and the amount of defocus Δf of the electrostatic lens 100, which occurs upon a change in gap D. Note that the direction in which the focal length of the electrostatic lens 100 increases is defined as the positive direction of the amount of defocus Δf, and the lens power is low when the amount of defocus Δf is positive. FIG. 3B is a graph showing the relationship between the gap D between the electrostatic lens 100 and the grid 302, and the amount of defocus Δf of the electrostatic lens 100 while a negative voltage is applied to the intermediate electrode 100b of the electrostatic lens 100. FIG. 3B shows the gap D on the abscissa, and the amount of defocus Δf on the ordinate. As can be seen from FIG. 3B, the amount of defocus Δf approximately linearly decreases with the gap D. A decrease in amount of defocus Δf amounts to be an increase in lens power. Therefore, the lens power of the electrostatic lens 100 increases as the gap D narrows while a negative voltage is applied to the intermediate electrode 100b of the electrostatic lens 100, that is, the upper electrode 100a has a concave lens power.

Figure 3D:
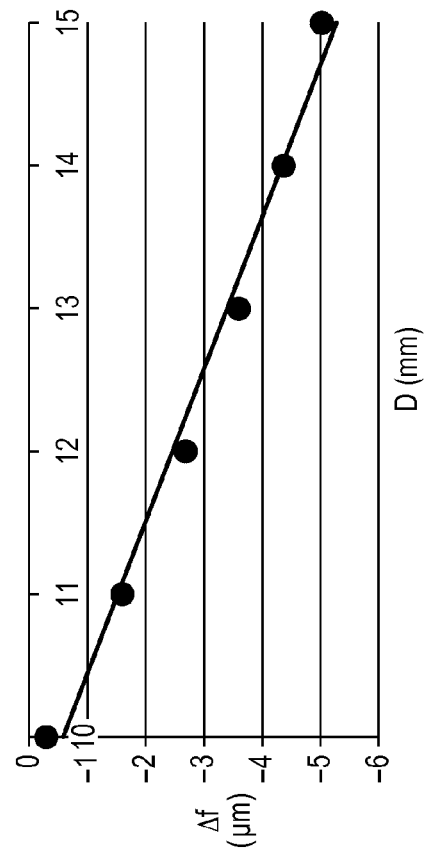
Figure 3C:
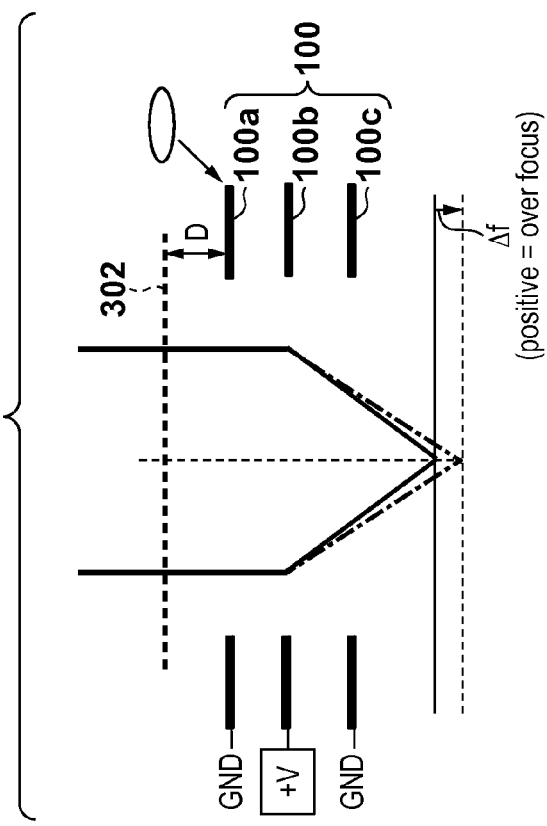

FIG. 3C shows the state in which a positive voltage is applied to the intermediate electrode 100b of the electrostatic lens 100 (the upper electrode 100a has a convex lens power). FIG. 3C shows the gap D between the electrostatic lens 100 and the grid 302 on the abscissa, and the amount of defocus Δf of the electrostatic lens 100, which occurs upon a change in gap D, like FIG. 3A. FIG. 3D is a graph showing the relationship between the gap D between the electrostatic lens 100 and the grid 302, and the amount of defocus Δf of the electrostatic lens 100 while a positive voltage is applied to the intermediate electrode 100b of the electrostatic lens 100. As can be seen from FIG. 3D, characteristics opposite to those shown in FIG. 3B appear, that is, the amount of defocus Δf approximately linearly increases with the gap D. Therefore, the lens power of the electrostatic lens 100 decreases as the gap D narrows while a positive voltage is applied to the intermediate electrode 100b of the electrostatic lens 100, that is, the upper electrode 100a has a convex lens power.

The lens power of the electrostatic lens 100 is considered to change upon a change in gap D between the electrostatic lens 100 and the grid 302, because the grid 302 is disposed to be immersed in the electrostatic field near the upper electrode 100a, and acts to weaken the lens field of the upper electrode 100a.

Referring, for example, to FIG. 3A, when the upper electrode 100a has a concave lens power, and the grid 302 is disposed to be immersed in the electrostatic field near the upper electrode 100a, an equipotential surface is formed at a position in proximity to the upper electrode 100a. With this arrangement, the electrostatic field near the upper electrode 100a is oriented more in the direction of the lens axis AX of the electrostatic lens 100. The component of the electrostatic field in the direction of the optical axis AX of the electrostatic lens 100 generates a lens power in the electrostatic lens 100. Hence, when the grid 302 is disposed in proximity to the electrostatic lens 100 (upper electrode 100a), the lens field of the upper electrode 100a weakens. Referring to FIG. 3A, because the upper electrode 100a has a concave lens power, the lens power of the entire electrostatic lens increases when the lens field of the upper electrode 100a weakens (that is, the action of the concave lens weakens) as the grid 302 is brought into proximity to the upper electrode 100a.

It is obvious that the same description as in FIG. 3A applies to FIG. 3C. Referring to FIG. 3C, when the upper electrode 100a has a convex lens power, and the grid 302 is brought into proximity to the upper electrode 100a so as to be immersed in the electrostatic field near the upper electrode 100a, the lens field of the upper electrode 100a weakens. Therefore, when the lens field of the upper electrode 100a weakens (that is, the action of the convex lens weakens) as the grid 302 is brought into proximity to the upper electrode 100a, the lens power of the entire electrostatic lens decreases.

As described above, in a configuration in which the flat grid 302 is brought into proximity to the electrostatic lens 100, the lens power of the entire electrostatic lens changes upon a change in gap D between the electrostatic lens 100 and the grid 302. In this embodiment, the lens power becomes lower in a region closer to the exterior of the lens axis AX of the electrostatic lens 100 so as to cancel the (positive) spherical aberration of the electrostatic lens 100 using such a phenomenon.

FIG. 4A shows the state in which a negative voltage is applied to the intermediate electrode 100b of the electrostatic lens 100, like FIG. 2A. Arrows shown in FIG. 4A indicate the state in which the lens power becomes higher in a region closer to the exterior of the lens axis AX of the electrostatic lens 100. FIG. 4B shows the state in which a curved grid 102 is disposed in proximity to the electrostatic lens 100 in the state shown in FIG. 4A, that is, the configuration of the charged particle optical system 10 according to this embodiment. The grid 102 has a curved surface shape which forms a convex surface bulged toward the electrostatic lens 100, as in FIG. 1A. With this arrangement, as a curved grid 102 which forms a convex surface bulged toward the electrostatic lens 100 is disposed to be immersed in the electrostatic field near the upper electrode 100a, the lens power can be set lower in a region closer to the exterior of the lens axis AX of the electrostatic lens 100. The lens power of the electrostatic lens 100 can be changed by changing the gap D between the electrostatic lens 100 and the grid 302, as described with reference to FIGS. 3A to 3D. Hence, the lens power can be set lower in a region closer to the exterior of the lens axis AX by setting the gap between the electrostatic lens 100 and the grid 102 wider in a region closer to the exterior of the lens axis AX, as shown in FIG. 4B. Referring to FIG. 4B, because the upper electrode 100a has a concave lens power, the grid 102 acts to set the lens power of the concave lens lower in a region closer to the exterior of the lens axis AX. This means that the lens power of the entire electrostatic lens becomes lower in a region closer to the exterior of the lens axis AX. With this arrangement, the difference between the on- and off-axis lens powers of the electrostatic lens 100 reduces (ideally, this difference becomes zero), so the spherical aberration of the electrostatic lens 100 is corrected, as indicated by arrows shown in FIG. 4B.

FIG. 4C shows the state in which a positive voltage is applied to the intermediate electrode 100b of the electrostatic lens 100, like FIG. 2B. Arrows shown in FIG. 4C indicate the state in which the lens power becomes higher in a region closer to the exterior of the lens axis AX of the electrostatic lens 100, as in FIG. 4A. FIG. 4D shows the state in which a curved grid 102 is disposed in proximity to the electrostatic lens 100 in the state shown in FIG. 4C, that is, the configuration of the charged particle optical system 10 according to this embodiment. The grid 102 has a curved surface shape which forms a concave surface receding from the electrostatic lens 100, as in FIG. 1C. With this arrangement, as a grid 102 with a curved surface shape which forms a concave surface receding from the electrostatic lens 100 is disposed to be immersed in the electrostatic field near the upper electrode 100a, the lens power can be set lower in a region closer to the exterior of the lens axis AX of the electrostatic lens 100. With this arrangement, the difference between the on- and off-axis lens powers of the electrostatic lens 100 reduces, so the spherical aberration of the electrostatic lens 100 is corrected, as indicated by arrows shown in FIG. 4D.

It would readily be understood from the foregoing description why the convex/concave shapes of the grids 102 in FIGS. 4B and 4D are opposite to each other. Referring to FIG. 4D, the upper electrode 100a has a convex lens power. Hence, to set the lens power lower in a region closer to the exterior of the lens axis AX of the electrostatic lens 100, it is necessary to set the lens power of the convex lens of the upper electrode 100a lower in a region closer to the exterior of the lens axis AX using the grid 102. To meet this requirement, the gap between the electrostatic lens 100 and the grid 102 need only be set narrower in a region closer to the exterior of the lens axis AX and, more specifically, the grid 102 need only have a curved surface shape which forms a concave surface receding from the electrostatic lens 100, as shown in FIG. 4D.

As described above, the orientation of the component of the electrostatic field EF, formed by the electrostatic lens 100, in the direction of the lens axis AX can be associated with the lens powers (convex or concave lens powers) of the upper electrode 100a and lower electrode 100c. Also, to cancel the (positive) spherical aberration of the electrostatic lens 100, the lens power need only be set lower in a region closer to the exterior of the lens axis AX of the electrostatic lens 100 using the grid 102. Hence, in this embodiment, the grid 102 has a shape (curved surface shape) with a distance from the electrostatic lens 100 in the direction of the lens axis AX of the electrostatic lens 100, which varies depending on the position. More specifically, if the upper electrode 100a (intermediate electrode 100b) has a concave lens power, the grid 102 has a curved surface shape which forms a convex surface bulged toward the electrostatic lens 100 so as to set the lens power of the concave lens lower in a region closer to the exterior of the lens axis AX of the electrostatic lens 100. However, if the upper electrode 100a (intermediate electrode 100b) has a convex lens power, the grid 102 has a concave surface shape receding from the electrostatic lens 100 so as to set the lens power of the convex lens lower in a region closer to the exterior of the lens axis AX of the electrostatic lens 100.

The curved surface shape of the grid 102 will be described in reference to a design example. The curved surface shape of the grid 102 is desirably a paraboloid of revolution having a rotation axis along the axis (lens axis) AX of the electrostatic lens 100 for the following reason. As described above, as the gap between the electrostatic lens 100 (upper electrode 100a or lower electrode 100c) and the grid 102 narrows, the lens power of the electrostatic lens 100 linearly varies in accordance with:

$$\Delta\theta(\alpha) = kD\alpha \quad (1)$$

where $\Delta\theta$ is the angular change of the trajectory of an electron beam due to defocus, D is the gap between the electrostatic lens 100 and the grid 102, $\alpha$ is the half-angle of convergence of the charged particle optical system 10, and k is a constant of proportionality. Also, the constant of proportionality k is negative if the outer electrodes of the electrostatic lens 100 (upper electrode 100a and lower electrode 100c) have a concave lens power, while it is positive if the outer electrodes of the electrostatic lens 100 have a convex lens power.

When D changes as a function of a for a curved grid 102, we have:

$$\Delta\theta(\alpha) = kD(\alpha)\alpha \quad (2)$$

To adjust $\Delta\theta$ in equation (2) to be equivalent to the aberration of the electrostatic lens 100 to be corrected, for example, the amount of cancellation of the spherical aberration $C_s\alpha^3$, $$kD(\alpha)\alpha = -C_s\alpha^3 \quad (3)$$

$$D(\alpha) = -(C_s/k)\alpha^2 \quad (4)$$

must be satisfied.

The case wherein the half-angle of convergence $\alpha$ and the distance (electron beam width) from the lens axis AX of the electrostatic lens 100 have a one-to-one correspondence, that is, the case wherein the image height is low, and the on-axis aberration is dominant will be considered. In this case, instead of the half-angle of convergence a, a distance R from the lens axis AX can be used to rewrite equation (4) as:

$$D(R) = -k'C_sR^2 \quad (5)$$

where k' is a constant calculated by multiplying $\alpha$ by a constant of proportionality in substituting R for $\alpha$. Like the constant of proportionality k, the constant k' is negative if the outer electrodes of the electrostatic lens 100 have a concave lens power, while it is positive if the outer electrodes of the electrostatic lens 100 have a convex lens power.

Equation (5) shows that the gap D is expressed as a quadratic function of the distance R from the lens axis AX, and the curved surface shape of the grid 102 is preferably a paraboloid of revolution having a rotation axis along the lens axis AX of the electrostatic lens 100.

Accordingly, the curved surface shape of the grid 102 is preferably a paraboloid of revolution having a rotation axis along the lens axis AX of the electrostatic lens 100. However, the curved surface shape of the grid 102 may form a spherical shape having a rotation axis along the lens axis AX in place of a paraboloid of revolution, in terms of, for example, machinability.

An example of the procedure of designing the curved surface shape of the grid 102 will be described. First, graphs shown in FIGS. 3B and 3D are obtained by electro-optical simulation in a model in which the flat grid 302 is in proximity to the electrostatic lens 100, as shown in FIGS. 3A and 3C. Depending on the position of the grid 302 relative to the electrostatic lens 100, linear relationships as presented in the graphs shown in FIGS. 3B and 3D may not be obtained (when, for example, the distance between the electrostatic lens 100 and the grid 302 is too large). It is therefore desired to confirm linear relationships, as presented in the graphs shown in FIGS. 3B and 3D, using a model for the flat grid 302 before a model for the curved grid 102 is devised.

As long as the relationship between the lens power and the gap between the electrostatic lens 100 and the flat grid 302 can be confirmed, the curved surface shape (initial model) of the grid 102 can be determined in accordance with equations (1) to (5). However, it is often impossible to sufficiently reduce the spherical aberration of the electrostatic lens 100 in the curved grid 102 based on the initial model. In such a case, upon defining, for example, k' in equation (5) as a parameter, electro-optical simulation is repeatedly executed to search for an optimum value. When the curved surface shape of the grid 102 is determined to form a paraboloid of revolution, an optimum value can be relatively easily found because one parameter alone is used.

Figures 5A, 5B, 5C:
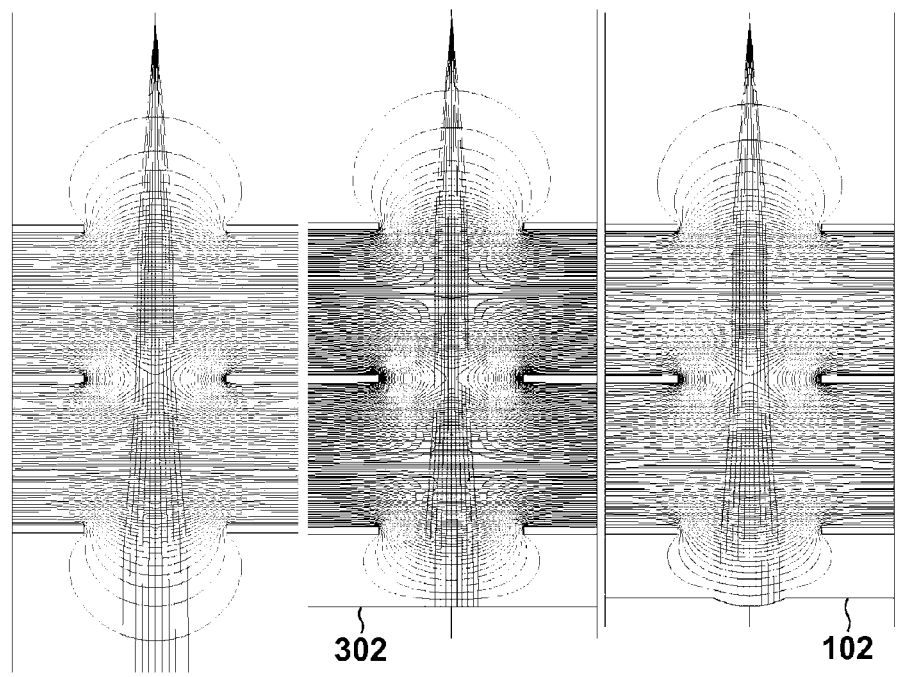
Figure 5D:
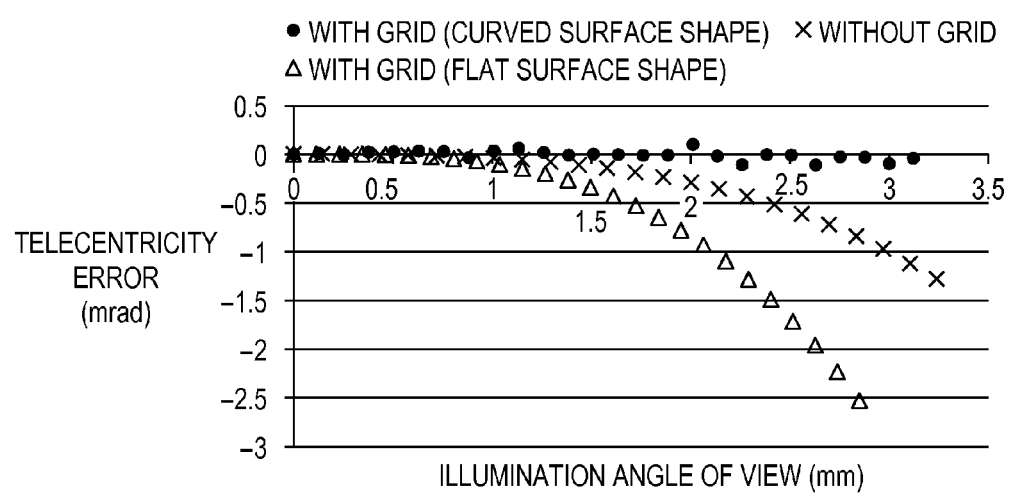
Figures 6A, 6B, 6C:
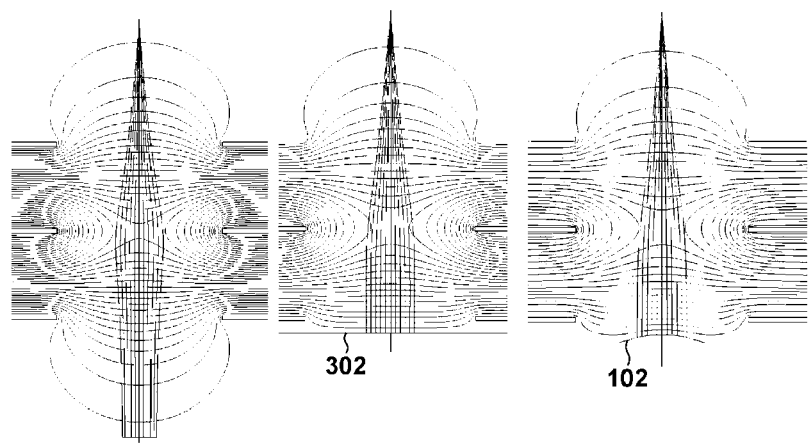
Figure 6D:
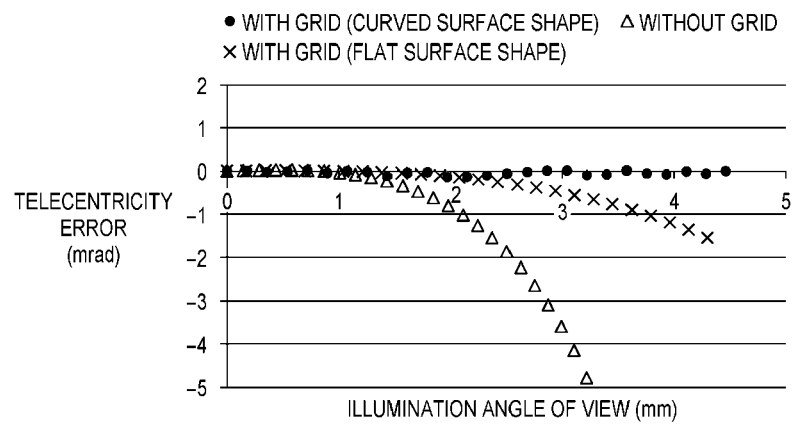

FIGS. 5A to 5E and 6A to 6E are views for explaining an effect of disposing a curved grid 102 in a wide-angle-of-view illumination optical system (charged particle optical system) including an Einzel lens (electrostatic lens), as described above. FIGS. 5A to 5C show the case wherein a positive voltage is applied to the intermediate electrode of the Einzel lens, and the upper and lower electrodes of the Einzel lens have a concave lens power. FIGS. 6A to 6C show the case wherein a negative voltage is applied to the intermediate electrode of the Einzel lens, and the upper and lower electrodes of the Einzel lens have a convex lens power. FIGS. 5A and 6A show the trajectories of electron beams when neither a flat grid 302 nor a curved grid 102 is present. FIGS. 5B and 6B show the trajectories of electron beams when a flat grid 302 is disposed. FIGS. 5C and 6C show the trajectories of electron beams when a curved grid 102 is disposed. The grid 102 has a curved surface shape which forms a concave surface receding from the Einzel lens in FIG. 5C, while it has a curved surface shape which forms a convex surface bulged toward the Einzel lens in FIG. 6C. Also, FIGS. 5A to 5C and 6A to 6C show not only the trajectories of electron beams analyzed by electro-optical simulation, but also equipotential lines. FIG. 5D is a graph showing the aberration characteristics of the illumination optical systems shown in FIGS. 5A to 5C, and shows the illumination angle of view on the abscissa, and the telecentricity error corresponding to the lens aberration on the ordinate. FIG. 5E shows the design parameters of the illumination optical systems shown in FIGS. 5A to 5C. FIG. 6D is a graph showing the aberration characteristics of the illumination optical systems shown in FIGS. 6A to 6C, and shows the illumination angle of view on the abscissa, and the telecentricity error corresponding to the lens aberration on the ordinate. FIG. 6E shows the design parameters of the illumination optical systems shown in FIGS. 6A to 6C.

As can be seen from FIGS. 5A to 5E and 6A to 6E, the aberration is reduced (corrected) over the entire region defined by the illumination angle of view when a curved grid 102 is disposed. With this arrangement, the aberration of the electrostatic lens 100 can be corrected by appropriately selecting the curved surface shape of the grid 102 (a shape which forms a convex or concave surface bulged toward or receding from the electrostatic lens 100) using the lens powers of the upper electrode 100a and lower electrode 100c of the electrostatic lens 100.

Also, although the aberration to be reduced by the curved grid 102 is assumed to be the spherical aberration of the electrostatic lens 100 in this embodiment, the present invention is not limited to this. When the charged particle optical system is assumed to be, for example, a projection optical system which reduces and projects an object with a very high image height (wide field) at a relatively small angle of convergence, the above-mentioned aberration (spherical aberration) substantially corresponds to distortion. Such distortion can also be reduced using the curved grid 102.

Second Embodiment

FIGS. 7A to 7D are schematic views each showing a projection optical system 20 as an example of the charged particle optical system. The projection optical system 20 includes an electrostatic lens 100 which functions as a projection lens, and reduces and projects a wide-field object.

Figure 7A:
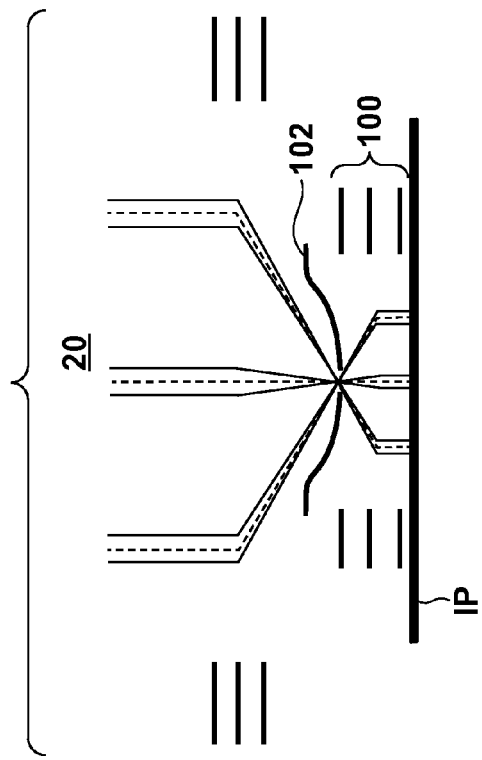
FIGS. 7A to 7D are schematic views each showing a projection optical system as an example of the charged particle optical system.
Figure 7B:
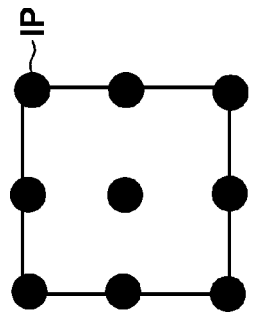

FIG. 7A shows the trajectory of an electron beam when no curved grid 102 is present. Referring to FIG. 7A, a principal ray with a high image height (an electron beam outside the field) curves inwards due to the aberration of the electrostatic lens 100, thus generating distortion in an image on an image plane IP. FIG. 7B shows an image pattern PT formed on the image plane IP by the projection optical system 20 shown in FIG. 7A. FIG. 7B shows an ideal image pattern IPT formed on the image plane IP by the projection optical system 20 when the electrostatic lens 100 is free from any aberrations. The ideal image pattern IPT serves as a spot pattern on a 3×3 grid. As can be seen from FIG. 7B, a shift has occurred between the position of the image pattern PT and that of the ideal image pattern IPT due to the aberration of the electrostatic lens 100.

Figure 7C:
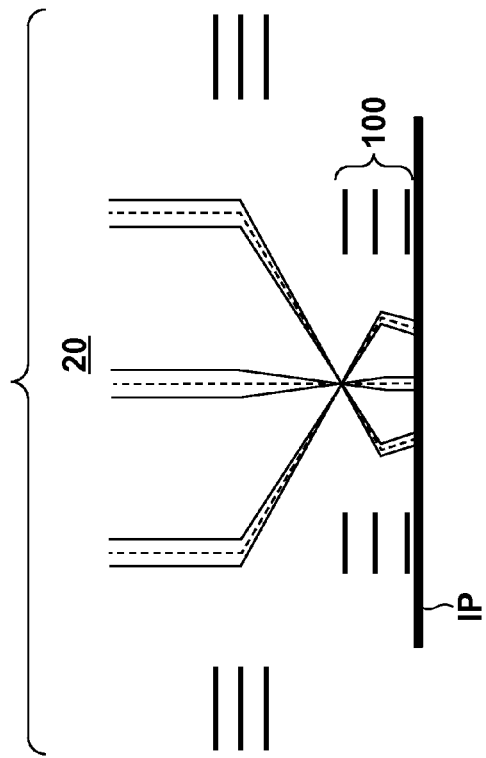
Figure 7D:
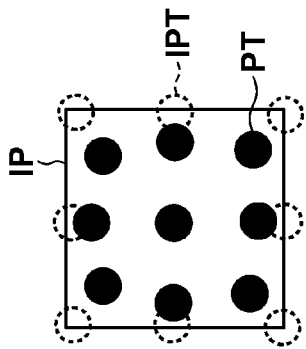

FIG. 7C shows the trajectory of an electron beam when a curved grid 102 is disposed near the position of the front focal plane of the electrostatic lens 100. The grid 102 has a shape which forms a convex surface bulged toward the electrostatic lens 100, and is disposed to be immersed in an electrostatic field formed by the electrostatic lens 100. Referring to FIG. 7C, because the grid 102 sets the lens power lower in a region closer to the exterior of a lens axis AX of the electrostatic lens 100, the aberration of the electrostatic lens 100 is reduced, so no distortion is generated in an image on the image plane IP (the distortion is corrected). FIG. 7D shows an image pattern PT formed on the image plane IP by the projection optical system 20 shown in FIG. 7C. The image pattern PT is identical to an ideal image pattern serving as a spot pattern on a 3×3 grid, so the image distortion is reduced.

In this embodiment, the curved grid 102 is formed by a curved electrode having a single hole at its center, and disposed so that the position of the single hole coincides with that of the front focal plane of the electrostatic lens 100. In other words, the grid 102 also functions as an NA stop, and can reduce the aberration of the electrostatic lens 100 without lowering the transmittance in a region where an electron beam is to be narrowed by the NA stop.

Third Embodiment

Figure 8:
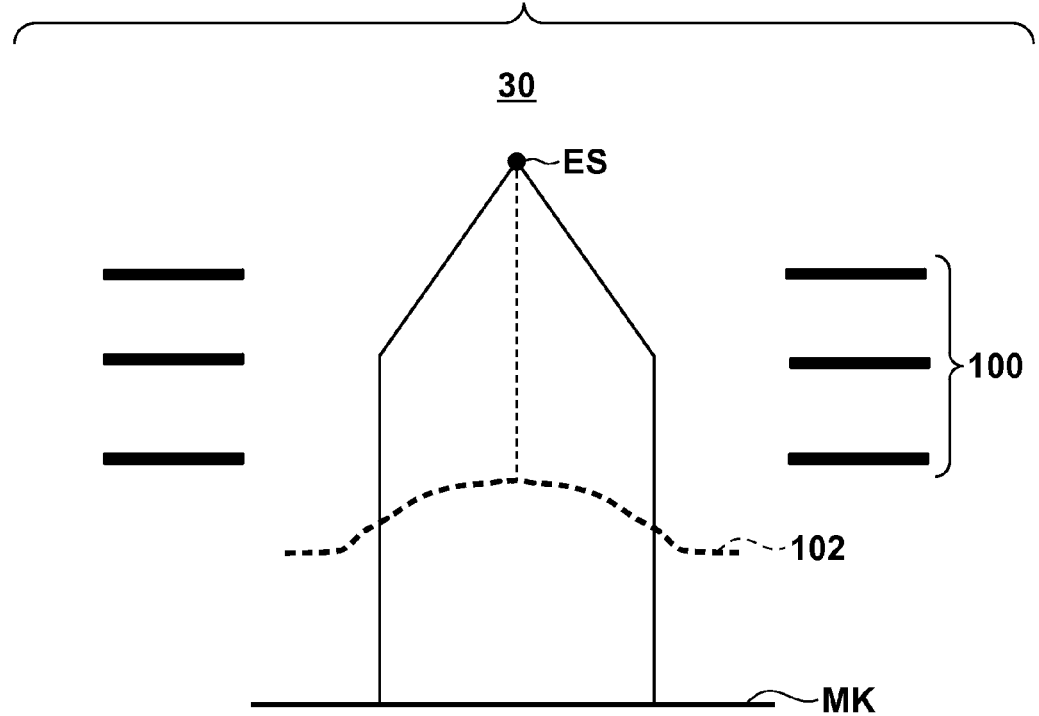
FIG. 8 is a schematic view showing an illumination optical system as another example of the charged particle optical system.

FIG. 8 is a schematic view showing an illumination optical system 30 as an example of the charged particle optical system. The illumination optical system 30 includes an electrostatic lens 100 and curved grid 102, and illuminates a mask MK.

An electron beam emitted by an electron source ES is collimated by the electrostatic lens 100. Note that a grid 102 with a shape which forms a convex surface bulged toward the electrostatic lens 100 is disposed in proximity to the electrostatic lens 100 so as to be immersed in an electrostatic field formed by the electrostatic lens 100. This makes it possible to reduce the aberration of the electrostatic lens 100, thereby obtaining an electron beam with a high telecentricity, as described above.

In this embodiment, the curved grid 102 is formed by, for example, conductor wires arranged in a square grid pattern, and has a high transmittance. The electron beam immediately after passage through the grid 102 has a lost portion blocked by the grid 102. However, at a position sufficiently spaced apart from the grid 102, due to widening of the angle of radiation that depends on the size of the electron source ES, the portion blocked by the grid 102 is compensated for by the ambient electron beam, so a substantially uniform electron beam is obtained. The mask MK is disposed at a position sufficiently spaced apart from the grid 102, and the illumination optical system 30 can illuminate the mask MK with an electron beam with a high telecentricity via the electrostatic lens 100 and grid 102.

Fourth Embodiment

Figure 9:
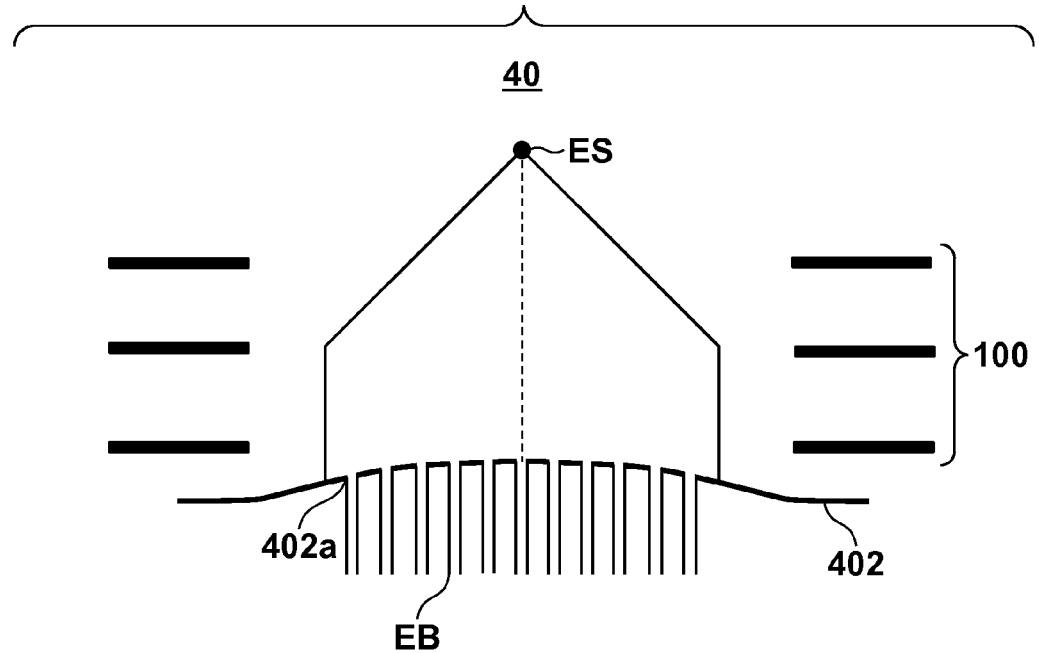
FIG. 9 is a schematic view showing an illumination optical system as still another example of the charged particle optical system.

FIG. 9 is a schematic view showing an illumination optical system 40 as an example of the charged particle optical system. The illumination optical system 40 includes an electrostatic lens 100 and aperture array 402. The aperture array 402 has a plurality of apertures 402a, and splits an electron beam (single beam) with a high telecentricity into a plurality of electron beams (multibeams) EB.

An electron beam emitted by the electron source ES is collimated by the electrostatic lens 100. Note that the aperture array 402 is disposed in proximity to the electrostatic lens 100 so as to be immersed in an electrostatic field formed by the electrostatic lens 100. In this embodiment, the aperture array 402 has a curved surface shape (for example, a paraboloid of revolution) which forms a convex surface bulged toward the electrostatic lens 100 so as to reduce the aberration of the electrostatic lens 100. For this reason, the aperture array 402 has not only a function of splitting an electron beam using the plurality of apertures 402a, but also the function of a curved grid 102. The illumination optical system 40 can generate a plurality of electron beams EB with a high telecentricity using the aperture array 402 equipped with both a function of splitting an electron beam, and the function of the curved grid 102.

Fifth Embodiment

Figure 10:
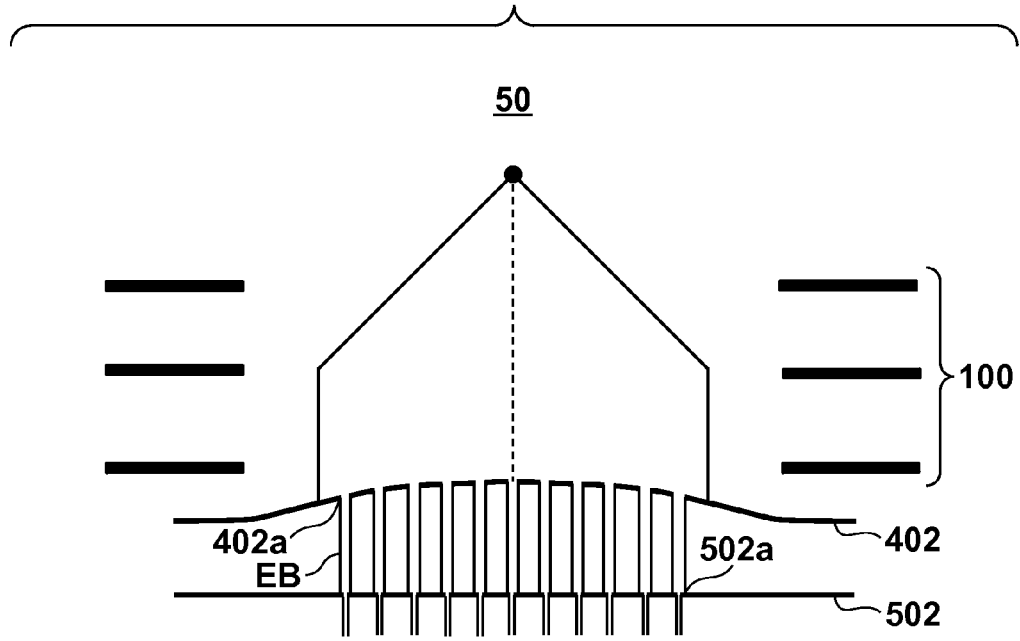
FIG. 10 is a schematic view showing an illumination optical system as still another example of the charged particle optical system.

FIG. 10 is a schematic view showing an illumination optical system 50 as an example of the charged particle optical system. The illumination optical system 50 is intended to improve the levels of ease in manufacturing and maintaining the aperture array 402 in the illumination optical system 40. Only differences of the illumination optical system 50 from the illumination optical system 40 will be described in this embodiment.

The illumination optical system 50 includes an aperture plate 502, in addition to an electrostatic lens 100 and aperture array 402. The aperture plate 502 has a plurality of apertures 502a which define the sizes of a plurality of electron beams EB split by the aperture array 402 (that is, which shape the plurality of electron beams EB). The aperture 502a in the aperture plate 502 has a size smaller than that of the aperture 402a in the aperture array 402. Also, the aperture plate 502 is formed by, for example, silicon which can be processed by high-accuracy hole etching using a lithography process. As the illumination optical system 50 includes an aperture plate 502 having apertures 502a formed by high-accuracy hole etching, the sizes of the electron beams EB split by the aperture array 402 can be defined with high accuracy even if the hole etching accuracy of the apertures 402a in the curved aperture array 402 is low. This relaxes the requirement for the processing accuracy of the apertures 402a in the aperture array 402, thereby improving the level of ease in manufacturing the aperture array 402. On the other hand, since the aperture plate 502 need not have a curved surface shape but may have, for example, a flat surface shape, it can be processed by high-accuracy hole etching.

Also, the illumination optical system 50 is provided with the aperture plate 502 so as to improve the level of ease in maintenance to remove contamination such as carbon which adheres to the aperture array 402. Because the aperture array 402 is directly irradiated with an electron beam, the sizes of the apertures 402a gradually decrease upon adhesion of contamination. Hence, the aperture array 402 is considered to require replacement after use for a long period of time. However, in this embodiment, because the sizes of the electron beams EB are not defined by the apertures 402a in the aperture array 402, contamination has little influence on the apertures 402a in the aperture array 402. Although an aperture plate 502 which defines the sizes of the electron beams EB may require replacement due to adhesion of contamination, it need only be replaced alone, so there is no need to replace the aperture array 402 (manufacture a new aperture array 402). In this manner, the level of ease in maintaining the aperture array 402 can be improved using a replaceable member only for the flat aperture plate 502.

Also, by replacing a mask MK with an aperture array (flat surface shape) having a plurality of apertures in the illumination optical system 30 shown in FIG. 8, the levels of ease in manufacturing and maintaining a curved grid 102 can be improved, as in the fifth embodiment.

Sixth Embodiment

Figure 11:
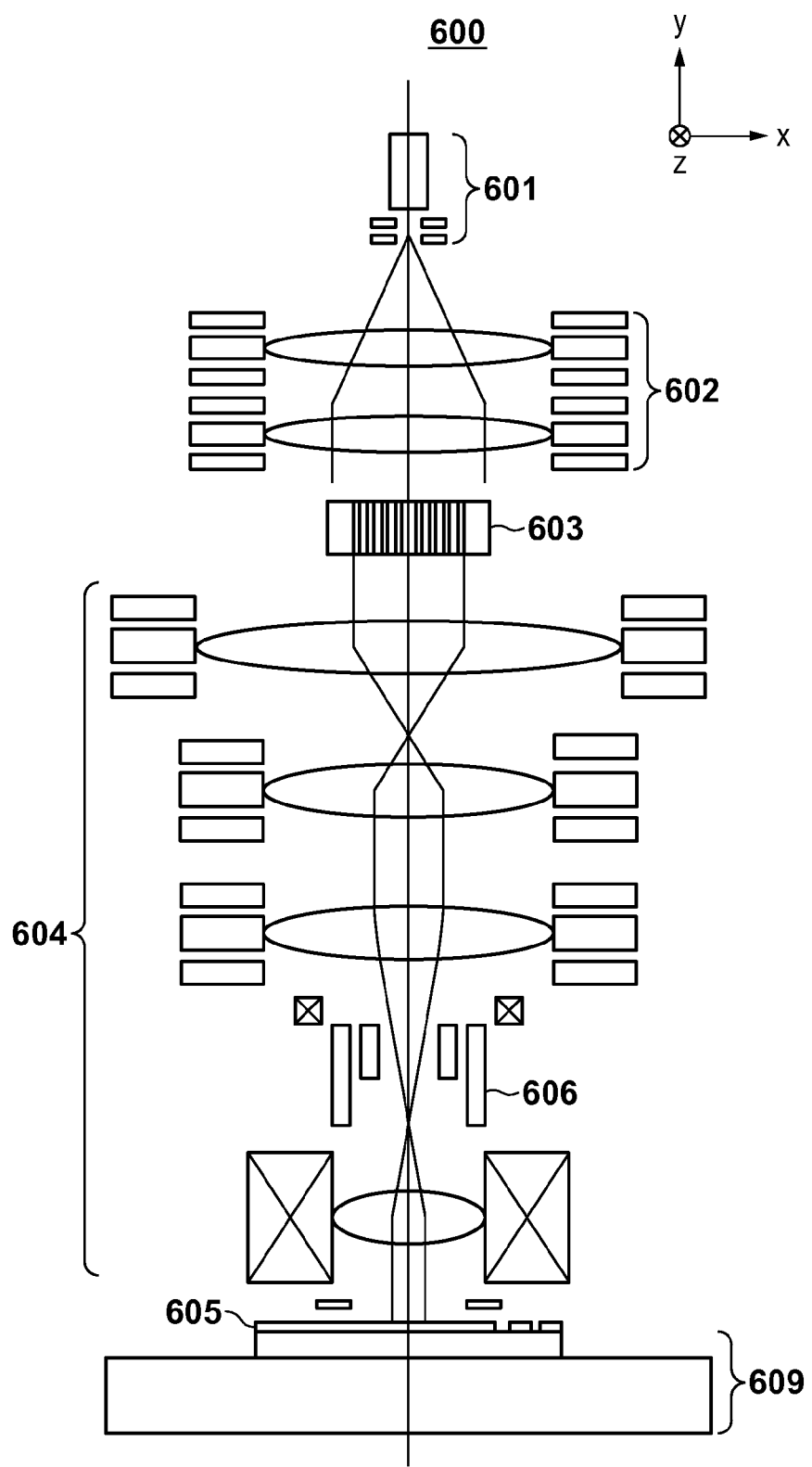
FIG. 11 is a schematic view showing the configuration of a drawing apparatus according to one aspect of the present invention.

FIG. 11 is a schematic view showing the configuration of a drawing apparatus 600 according to one aspect of the present invention. The drawing apparatus 600 serves as a lithography apparatus which draws a pattern on a substrate with an electron beam. The drawing apparatus 600 includes an electron gun 601, a condenser lens 602, a correction optical system 603, a reduction optical system 604, a deflector 606, and a substrate stage 609 which moves upon holding a substrate 605.

An electron beam emitted by the electron gun 601 is nearly collimated by the condenser lens 602, and enters the correction optical system 603. The correction optical system 603 forms a plurality of intermediate images. The reduction optical system 604 reduces and projects the plurality of intermediate images formed by the correction optical system 603 onto the substrate 605 (that is, forms an image on the substrate 605).

The deflector 606 deflects the electron beam from the correction optical system 603 to displace a plurality of images in almost the same amount in the X- and Y-directions on the substrate 605. In other words, the deflector 606 deflects the electron beam, guided onto the substrate 605, so as to move on the substrate 605.

The substrate stage 609 includes a θ-Z stage movable in the optical axis (Z-) direction and a rotation direction about the X-axis, and an X-Y stage movable in the X- and Y-directions perpendicular to the optical axis, and holds the substrate 605. Note that a Faraday cup which detects the amount of charge of the electron beam from the correction optical system 603, for example, is arranged on the substrate stage 609.

In the drawing apparatus 600, a charged particle optical system having a curved grid 102 as mentioned above is applied to optical systems including electrostatic lenses, such as the correction optical system 603 and reduction optical system 604. With this arrangement, the aberrations in the correction optical system 603 and reduction optical system 604 are reduced in the drawing apparatus 600. Hence, the drawing apparatus 600 can attain excellent drawing accuracy to provide an article such as a high-quality device (for example, a semiconductor integrated circuit device or a liquid crystal display device) with a high throughput and good economic efficiency. Note that an article such as a device is manufactured through a step of drawing a pattern on a substrate (for example, a wafer or a glass plate) coated with a resist (photosensitive agent) using the drawing apparatus 600, a step of developing the substrate having the pattern drawn on it, and subsequent known steps.

Also, although a curved grid is disposed near either of the upper and lower electrodes of the electrostatic lens in this embodiment, it may be disposed near each of the upper and lower electrodes of the electrostatic lens.

Seventh Embodiment

FIGS. 12A to 12D are schematic views each showing a projection optical system (projection system) 20A as an example of the charged particle optical system, as in the second embodiment. The projection optical system 20A includes an electrostatic lens group including an electrostatic lens 100, and reduces and projects a wide-field object.

Figure 12C:
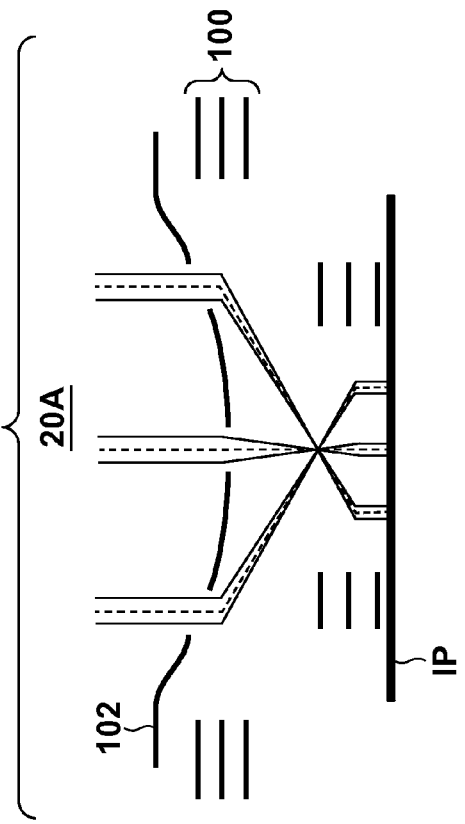
FIGS. 12A to 12D are schematic views each showing a projection optical system as still another example of the charged particle optical system.
Figure 12D:
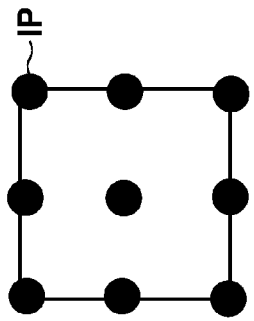
Figure 12A:
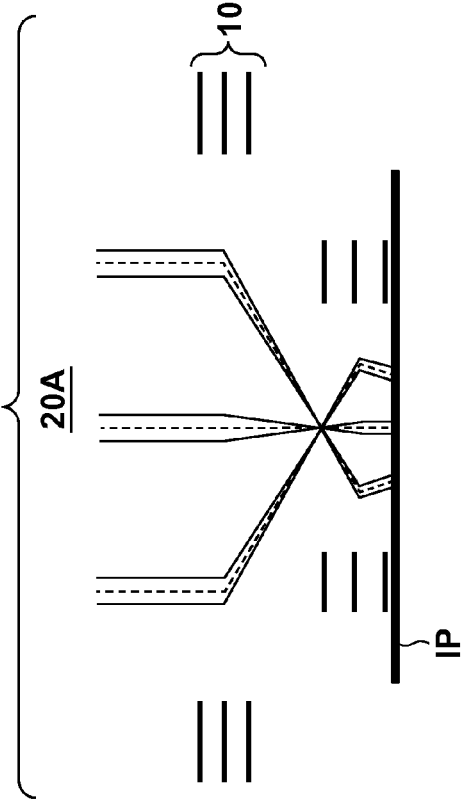
Figure 12B:
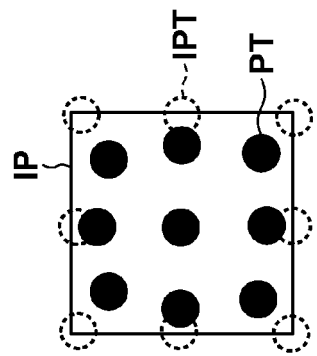

FIG. 12A is a view showing the trajectory of an electron beam when no curved grid 102 is present. Referring to FIG. 12A, a principal electron beam with a high image height (an electron beam outside the field) curves inwards due to the aberration of the electrostatic lens group, thus generating distortion in an image on an image plane IP. FIG. 12B shows an image pattern PT formed on the image plane IP by the projection optical system 20A shown in FIG. 12A. FIG. 12B also shows an ideal image pattern IPT formed on the image plane IP by the projection optical system 20A when the electrostatic lens 100 is free from any aberrations. The ideal image pattern IPT serves as a spot pattern on a 3×3 grid. As can be seen from FIG. 12B, a shift has occurred between the position of the image pattern PT and that of the ideal image pattern IPT due to the aberration of the electrostatic lens group. FIG. 12C shows the trajectory of an electron beam when a curved grid 102 is disposed near the upper electrode of the electrostatic lens 100. The grid 102 has a shape which forms a convex surface bulged toward the electrostatic lens 100, and is disposed to be immersed in an electrostatic field formed by the electrostatic lens 100. Referring to FIG. 12C, because the grid 102 sets the lens power lower in a region closer to the exterior of an optical axis AX of the electrostatic lens 100, the aberration of the electrostatic lens group is reduced, so no distortion is generated in an image on the image plane IP (the distortion is corrected).

FIG. 12D shows an image pattern PT formed on the image plane IP by the projection optical system 20A shown in FIG. 12C. The image pattern PT is identical to an ideal image pattern serving as a spot pattern on a 3×3 grid, so the image distortion is reduced. Although the curved grid 102 disposed near the upper electrode of the electrostatic lens 100 may have a shape that corrects the spherical aberration of the electrostatic lens 100, it more preferably has a shape that corrects the spherical aberration of the entire projection system. The grid 102 is designed so that, for example, a portion formed by the electrostatic lens 100 and curved grid 102 has a negative spherical aberration, and the negative spherical aberration and a positive spherical aberration in the succeeding stage cancel each other (at least reduce the spherical aberration of the entire system).

Figure 13A:
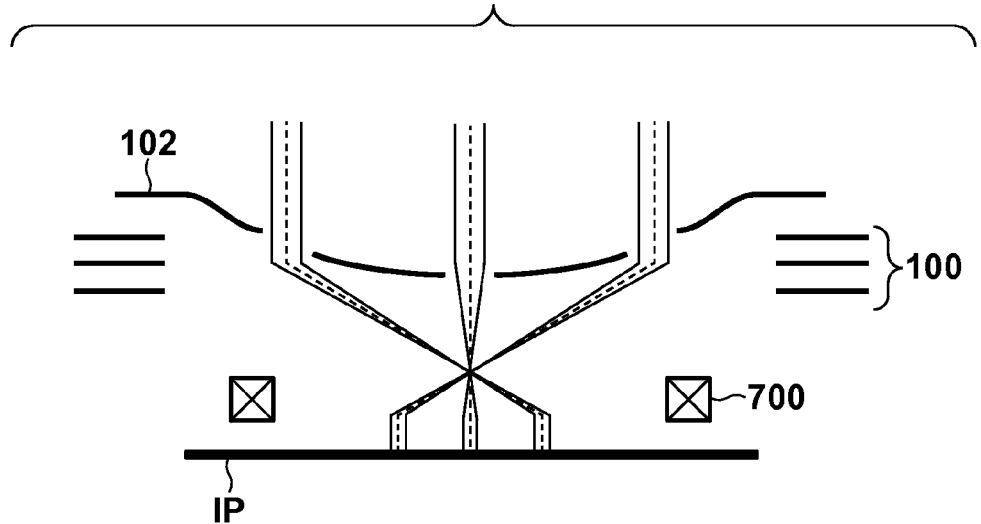
FIGS. 13A and 13B are schematic views each showing a projection optical system as still another example of the charged particle optical system.
Figure 13B:
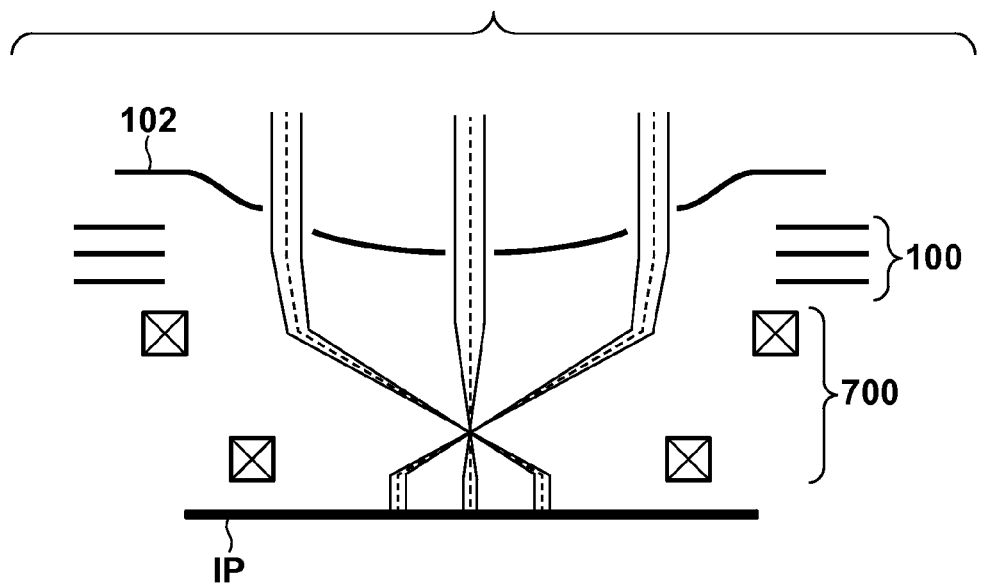

Also, the present invention is not limited to a configuration which uses electrostatic lenses for all electron lenses constituting a projection system, and is applicable to a projection system which at least partially includes a magnetic lens 700, as shown in, for example, FIGS. 13A and 13B. Regardless of whether an electrostatic lens or a magnetic lens is selected, the projection system is generally implemented by a bilateral telecentric system, and therefore formed by two or more electron lenses. However, the present invention is not limited to this, and a projection system formed by one electrostatic lens 100 and curved grid 102 may be employed.

Note that this embodiment illustrates an example in which multibeams arranged in a wide field are set on the object plane, and the curved grid 102 is provided with holes (apertures) in a number equal to the number of multibeams to pass these multibeams. This embodiment also illustrates an example in which multibeams are already generated in the preceding stage (on the charged particle source side) of the curved grid 102. However, the present invention is not limited to this, and a configuration in which the curved grid 102 is irradiated with a single collimated beam to have it generate multibeams may be employed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2012-092478 filed on Apr. 13, 2012, and 2013-014833 filed on Jan. 29, 2013, which are hereby incorporated by reference herein in their entirety.

What is claimed is:

1. A charged particle optical system which emits a charged particle beam, the system comprising:
    an electrostatic lens; and
    a grid electrode opposed to the electrostatic lens along an optical axis of the electrostatic lens, and configured to form an electrostatic field in cooperation with the electrostatic lens,
    wherein the grid electrode is configured such that an electrode surface, opposed to the electrostatic lens, of the grid electrode has a distance, from the electrostatic lens in a direction of the optical axis, which varies with a position in the electrode surface.

2. The system according to claim 1, wherein the electrode surface has such a shape that a spherical aberration of the electrostatic lens is smaller than that in a case where the electrode surface has the distance which does not vary with a position in the electrode surface.

3. The system according to claim 1, wherein a component, parallel to the optical axis, of an electrostatic force applied to the charged particle beam from the electrostatic field is orientated to the electrostatic lens from the electrode surface, and the electrode surface has a shape concave toward the electrostatic lens.

4. The system according to claim 1, wherein a component, parallel to the optical axis, of an electrostatic force applied to the charged particle beam from the electrostatic field is orientated to the electrode surface from the electrostatic lens, and the electrode surface has a shape convex toward the electrostatic lens.

5. The system according to claim 1, wherein the grid electrode includes conductor wires arranged in a lattice pattern.

6. The system according to claim 1, wherein a plurality of apertures, which split charged particle beam incident on the grid electrode into a plurality of charged particle beams, are formed in the grid electrode.

7. The system according to claim 6, further comprising an aperture plate in which a plurality of apertures, which shape the plurality of charged particle beams generated by the grid electrode, are formed.

8. The system according to claim 1, wherein a shape of the electrode surface is one of a paraboloid and a sphere of revolution, each of which has, as an axis of the revolution, the optical axis.

9. A drawing apparatus which performs drawing on a substrate with a charged particle beam, the apparatus comprising:
a charged particle optical system defined in claim 1 and configured to emit the charged particle beam toward the substrate.

10. A method of manufacturing an article, the method comprising:
performing drawing on a substrate using a drawing apparatus;
developing the substrate on which the drawing has been performed; and
processing the developed substrate to manufacture the article,
wherein the drawing apparatus performs drawing on the substrate with a charged particle beam, and includes a charged particle optical system which emits the charged particle beam, the system including:
an electrostatic lens; and
a grid electrode opposed to the electrostatic lens along an optical axis of the electrostatic lens, and configured to form an electrostatic field in cooperation with the electrostatic lens,
wherein the grid electrode is configured such that an electrode surface, opposed to the electrostatic lens, of the grid electrode has a distance, from the electrostatic lens in a direction of the optical axis, which varies with a position in the electrode surface.

11. A charged particle optical system which projects a charged particle beam on an object plane onto an image plane, the system comprising:
an electrostatic lens; and
a grid electrode opposed to the electrostatic lens along an optical axis of the electrostatic lens, and configured to form an electrostatic field in cooperation with the electrostatic lens,
wherein the grid electrode is configured such that an electrode surface, opposed to the electrostatic lens, of the grid electrode has a distance, from the electrostatic lens in a direction of the optical axis, which varies with a position in the electrode surface.

12. The system according to claim 11, wherein the electrode surface has such a shape that a spherical aberration of the electrostatic lens is smaller than that in a case where the electrode surface has the distance which does not vary with a position in the electrode surface.

13. The system according to claim 11, wherein a component, parallel to the optical axis, of an electrostatic force applied to the charged particle beam from the electrostatic field is orientated to the electrostatic lens from the electrode surface, and the electrode surface has a shape concave toward the electrostatic lens.

14. The system according to claim 11, wherein a component, parallel to the optical axis, of an electrostatic force applied to the charged particle beam from the electrostatic field is orientated to the electrode surface from the electrostatic lens, and the electrode surface has a shape convex toward the electrostatic lens.

15. The system according to claim 11, wherein the grid electrode includes conductor wires arranged in a lattice pattern.

16. The system according to claim 11, wherein a plurality of apertures, which split charged particle beam incident on the grid electrode into a plurality of charged particle beams, are formed in the grid electrode.

17. The system according to claim 16, further comprising an aperture plate in which a plurality of apertures, which shape the plurality of charged particle beams generated by the grid electrode, are formed.

18. The system according to claim 11, wherein a shape of the electrode surface is one of a paraboloid and a sphere of revolution, each of which has, as an axis of the revolution, the optical axis.

19. A drawing apparatus which performs drawing on a substrate with a charged particle beam, the apparatus comprising:
a charged particle optical system defined in claim 11 and configured to emit the charged particle beam toward the substrate.

20. A method of manufacturing an article, the method comprising:
performing drawing on a substrate using a drawing apparatus;
developing the substrate on which the drawing has been performed; and
processing the developed substrate to manufacture the article,
wherein the drawing apparatus performs drawing on the substrate with a charged particle beam, and includes a charged particle optical system which projects a charged particle beam on an object plane onto an image plane, the system including:
an electrostatic lens; and
a grid electrode opposed to the electrostatic lens along an optical axis of the electrostatic lens, and configured to form an electrostatic field in cooperation with the electrostatic lens,
wherein the grid electrode is configured such that an electrode surface, opposed to the electrostatic lens, of the grid electrode has a distance, from the electrostatic lens in a direction of the optical axis, which varies with a position in the electrode surface.

21. A charged particle optical system which emits a charged particle beam, the system comprising:
an electrostatic lens; and
a grid electrode opposed to the electrostatic lens along an optical axis of the electrostatic lens, and configured to form an electrostatic field in cooperation with the electrostatic lens, wherein
the grid electrode includes conductor wires arranged in a lattice pattern, and
the grid electrode is configured such that an electrode surface, opposed to the electrostatic lens, of the grid electrode has a distance, from the electrostatic lens in a direction of the optical axis, which varies with a position in the electrode surface.

22. The system according to claim 21, wherein the electrode surface has such a shape that a spherical aberration of the electrostatic lens is smaller than that in a case where the electrode surface has the distance which does not vary with a position in the electrode surface.

23. The system according to claim 21, wherein a component, parallel to the optical axis, of an electrostatic force applied to the charged particle beam from the electrostatic field is orientated to the electrostatic lens from the electrode surface, and the electrode surface has a shape concave toward the electrostatic lens.

24. The system according to claim 21, wherein a component, parallel to the optical axis, of an electrostatic force applied to the charged particle beam from the electrostatic field is orientated to the electrode surface from the electrostatic lens, and the electrode surface has a shape convex toward the electrostatic lens.

25. The system according to claim 21, further comprising an aperture plate in which a plurality of apertures, which shape the plurality of charged particle beams generated by the grid electrode, are formed.

26. The system according to claim 21, wherein a shape of the electrode surface is one of a paraboloid and a sphere of revolution, each of which has, as an axis of the revolution, the optical axis.

27. A drawing apparatus which performs drawing on a substrate with a charged particle beam, the apparatus comprising:
a charged particle optical system defined in claim 21 and configured to emit the charged particle beam toward the substrate.

28. A method of manufacturing an article, the method comprising:
performing drawing on a substrate using a drawing apparatus;
developing the substrate on which the drawing has been performed; and
processing the developed substrate to manufacture the article,
wherein the drawing apparatus performs drawing on the substrate with a charged particle beam, and includes a charged particle optical system which emits the charged particle beam, the system including:
an electrostatic lens; and
a grid electrode opposed to the electrostatic lens along an optical axis of the electrostatic lens, and configured to form an electrostatic field in cooperation with the electrostatic lens, wherein
the grid electrode includes conductor wires arranged in a lattice pattern, and
the grid electrode is configured such that an electrode surface, opposed to the electrostatic lens, of the grid electrode has a distance, from the electrostatic lens in a direction of the optical axis, which varies with a position in the electrode surface.

* * * * *